United States Patent
Mandelman et al.

(10) Patent No.: US 6,808,981 B2
(45) Date of Patent: Oct. 26, 2004

(54) METHOD FOR FABRICATING 6F² TRENCH DRAM CELL WITH DOUBLE-GATED VERTICAL MOSFET AND SELF-ALIGNED STI

(75) Inventors: Jack A. Mandelman, Stormville, NY (US); Ramachandra Divakaruni, Somers, NY (US); Carl J. Radens, LaGrangeville, NY (US); Gary B. Bronner, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 10/375,654

(22) Filed: Feb. 27, 2003

(65) Prior Publication Data

US 2003/0160272 A1 Aug. 28, 2003

Related U.S. Application Data

(62) Division of application No. 09/766,013, filed on Jan. 18, 2001, now Pat. No. 6,570,208.

(51) Int. Cl.⁷ .......................................... H01L 21/8242
(52) U.S. Cl. ..................................................... 438/243
(58) Field of Search ............................... 438/242–244, 438/245, 248, 246, 247, 249, 251; 257/301–305, E27.092, E27.095, E29.346, E21.396, E27.096, E27.097, E29.246, E21.651

(56) References Cited

U.S. PATENT DOCUMENTS

| | | | | |
|---|---|---|---|---|
| 5,937,292 A | * | 8/1999 | Hammerl et al. | 438/243 |
| 6,190,971 B1 | * | 2/2001 | Gruening et al. | 438/243 |
| 6,284,593 B1 | * | 9/2001 | Mandelman et al. | 438/248 |
| 6,339,241 B1 | * | 1/2002 | Mandelman et al. | 257/301 |
| 6,440,872 B1 | * | 8/2002 | Mandelman et al. | 438/745 |
| 6,441,422 B1 | | 8/2002 | Mandelman et al. | |
| 2002/0085434 A1 | * | 7/2002 | Mandelman et al. | 365/200 |

* cited by examiner

Primary Examiner—W. David Coleman
Assistant Examiner—Brook Kebede
(74) Attorney, Agent, or Firm—Scully, Scott, Murphy & Presser; Todd M.C. Li

(57) ABSTRACT

A memory cell containing double-gated vertical metal oxide semiconductor field effect transistors (MOSFETs) and isolation regions such as shallow trench isolation, STI, regions that are self-aligned to the wordlines and bitlines of the cell are provided. The inventive memory cell substantially eliminates the backgating problem and floating well effects that are typically present in prior art memory cells. A method of fabricating the inventive memory cell is also provided.

14 Claims, 17 Drawing Sheets

SUPPORT GC & S/D IMPLANTS

METHOD FOR FABRICATING 6F² TRENCH DRAM CELL WITH DOUBLE-GATED VERTICAL MOSFET AND SELF-ALIGNED STI

This application is a divisional of U.S. application Ser. No. 09/766,013, filed Jan. 18, 2001 now U.S. Pat. No. 6,570,208.

FIELD OF THE INVENTION

The present invention relates to semiconductor memory devices, and more particularly to an embedded dynamic random access memory (EDRAM) cell that contains double-gated vertical metal oxide semiconductor field effect transistors (MOSFETs) and isolation regions such as shallow trench isolation (STI) regions that are self-aligned to the wordlines and bitlines. The inventive memory cell, which is scalable below a minimum feature size, F, of about 110 nm, substantially eliminates backgating due to an adjacent wordline as well as problems caused by a floating-well. The present invention also relates to a method of producing the above-mentioned memory cell.

BACKGROUND OF THE INVENTION

As conventional vertical DRAM cells are scaled below a design groundrule of about 110 nm, encroachment of the buried-strap region upon the sidewall of the adjacent storage trench cuts-off the path holes flowing into and out of the portion of the P-well above the buried-strap region.

Simulation has demonstrated that floating-well effects limit the scalability of prior art vertical DRAM memory arrays to a minimum distance of about 90 nm between adjacent storage trenches. A number of dynamic leakage mechanisms limiting the scalability of conventional vertical DRAM memory cells have been identified and quantified. Included in the dynamic leakage mechanisms are: (1) Floating-well bitline disturb (FWBD), (2) Transient drain induced barrier lowering (TDIBL), and (3) Adjacent wordline induced punchthrough (AWIPT).

The onset of serious charge loss due to each mechanism occurs at approximately 90 nm end of process deep trench (DT) to deep trench (DT) spacing. Thus, scalability of conventional vertical DRAM memory cells beyond about 110 nm is expected to be limited by floating-well effects.

An illustration of a dominant floating-well dynamic leakage mechanism that limits scalability of prior art vertical DRAM memory arrays is shown in FIG. 1. Specifically, at a time indicated by point A of FIG. 1 and during a long period of about 5–100 ms of repeated writing of a "1" to other memory cells on the bitline, the P-well of an unselected cell storing a "1" may leak up towards bitline voltage ($V_{blh}$), as the exiting of holes is restricted by parasitic JFET. Leakage depends on the degree of well isolation caused by pinchoff from expansion of the storage node depletion region. In an extreme case, the buried-strap region may come in contact with the adjacent deep trench capacitor. Moreover, the hole current through the pinchoff region must keep up with the leakage to avoid a pseudo "Floating-Body Effect".

Insofar as time interval B-C is concerned, the N+ bitline diffusion to P-well barrier is lowered by a downward swing of $V_{blh}$. Electrons emitted from the bitline diffusion region are collected by the storage node resulting in the formation of a parasitic bipolar transistor, $Q_B$, ($PW_{int}$ is a floating base) within the memory cell array.

For aggressively scaled vertical metal oxide semiconductor field effect transistors (MOSFETs) in prior art vertical DRAM memory cells, the depletion region from the storage node diffusion (i.e., buried-strap outdiffusion) encroaches upon the sidewall of the adjacent storage trench, which results in dynamic charge loss from the storage capacitor as the bitline of an unselected device is cycled. This charge loss mechanism is identical to that published in "Floating-Body Concerns for SOI Dynamic Random Access Memory (DRAM)", Proceedings, 1996 IEEE International SOI Conference, Jack Mandelman, et al. pp. 1367–137, October 1996.

An illustration of the storage capacitor voltage vs. the voltage in the portion of the P-well isolated by the depletion region from the buried-strap outdiffusion, as the bitline is cycled, is shown in FIG. 2. When the bitline is held at $V_{blh}$, the isolation portion of the P-well leaks up towards the voltage of the adjacent diffusions. With subsequent cycling of the bitline between 0.0 and $V_{blh}$, the dynamic charge loss mechanism results in charge pumping which discharges the storage capacitor. Between data refresh, greater than $10^6$ bitline cycles are possible, which is sufficient to discharge the storage capacitor.

Another problem with prior art DRAM cells is backgating which causes back side leakage that is gated by the adjacent wordline in the DRAM CELL. An illustration of the backside leakage problem is shown, for example, in FIG. 3.

In view of the drawbacks mentioned hereinabove with prior art memory cells (i.e., floating-well effects and backgating); there is a continued need for developing a new and improved memory cell which is substantially immune to the floating-well and backgating problems.

SUMMARY OF THE INVENTION

One object of the present invention is to provide a memory, cell that substantially eliminates floating-well effects that are typically present in prior art memory cells.

Another object of the present invention is to provide a memory cell that substantially eliminates the prior art backgating problem due to an adjacent wordline.

A further object of the present invention is to provide a memory cell that is scalable below a minimum feature size of about 110 nm.

These and other objects and advantages are obtained by providing a memory cell which includes at least double-gated vertical MOSFETs and isolation regions that are self-aligned to the wordlines and bitlines of the cell. The double-gated vertical array MOSFETs provide for stronger gate control, higher current drive, steeper sub-threshold, i.e., $V_t$, slope, reduced substrate sensitivity, reduced short channel effect (DIBL) and allows for larger deep trench, DT, width.

In one aspect of the present invention, a method of producing a memory cell which includes at least double-gated vertical MOSFETs and isolation regions that are self-aligned to the wordlines and bitlines of the cell is provided. The inventive method includes the steps of:

(a) forming a plurality of deep trenches in a Si-containing substrate in an array portion of a memory cell, said plurality of deep trenches being arranged in rows and columns and including at least collar filled divot regions which are filled with a strap placeholder material;

(b) forming double-gated vertical MOSFETs in said plurality of deep trenches, wherein said double-gated vertical MOSFETs include at least two gates on opposing sidewalls and exposed gate conductors, wherein one of said sidewalls also contains a buried-strap region;

(c) forming wordlines overlaying said double-gated vertical MOSFETs and in contact with said exposed gate conductors, wherein said wordlines are formed in said column direction;

(d) protecting said array portion of said memory cell;

(e) forming support MOSFETs while said array portion is protected;

(f) protecting said support MOSFETs;

(g) forming sidewalls spacers on said double-gated vertical MOSFETs;

(h) forming bitlines on said Si-containing substrate that are orthogonal to said wordlines; and (i) forming isolation trench regions into said Si-containing substrate adjacent to said rows of deep trenches, wherein said isolation trench regions have a depth that is deeper than abutting bitline diffusion regions.

In one embodiment of the present invention, the buried-strap is confined to a location that is at a central portion of at least one sidewall of the MOSFETs.

It is noted that the inventive method described by processing steps (a)–(i) above is a dual workfunction and lithography friendly process. Moreover, the inventive method decouples the array and support process and eliminates an active area (AA) mask (critical mask) for the array process.

Another aspect of the present invention relates to a memory cell which includes at least double-gated vertical MOSFETs and isolation regions that are self-aligned to the wordlines and bitlines of the cell. Specifically, the inventive memory cell array comprises:

a plurality of memory cells formed in an array portion of a Si-containing substrate which are arranged in rows and columns, each memory cell including a double-gated vertical metal oxide semiconductor field effect transistor (MOSFET) having exposed gate conductor regions and two gates formed on opposing sidewalls of said MOSFETs, wherein one of the opposing sidewalls also includes a confined buried-strap;

a plurality of wordlines overlaying said double-gated vertical MOSFETs and in contact with said exposed gate conductor regions, said wordlines being arranged in said column direction;

a plurality of bitlines that are orthogonal to said wordlines; and trench isolation regions formed adjacent to said rows of memory cells, wherein said trench isolation regions have a depth that is deeper than abutting bitline diffusion regions.

BRIEF DESCRIPTION OF THE DRAWINGS

In FIGS. 5–14, top views (A) are shown as well as cross-sectionals through various cuts including through the deep trench region (B), Y1—Y1, and through the region between rows of deep trenches (C), Y2—Y2. In some instances, a cut through the cross-section perpendicular to Y1—Y1 and Y2—Y2, i.e., X1—X1 is shown. Cut X—X is in a plane containing both storage trench and the body of the vertical MOSFET (D).

DETAILED DESCRIPTION OF THE INVENTION

Figure 1:
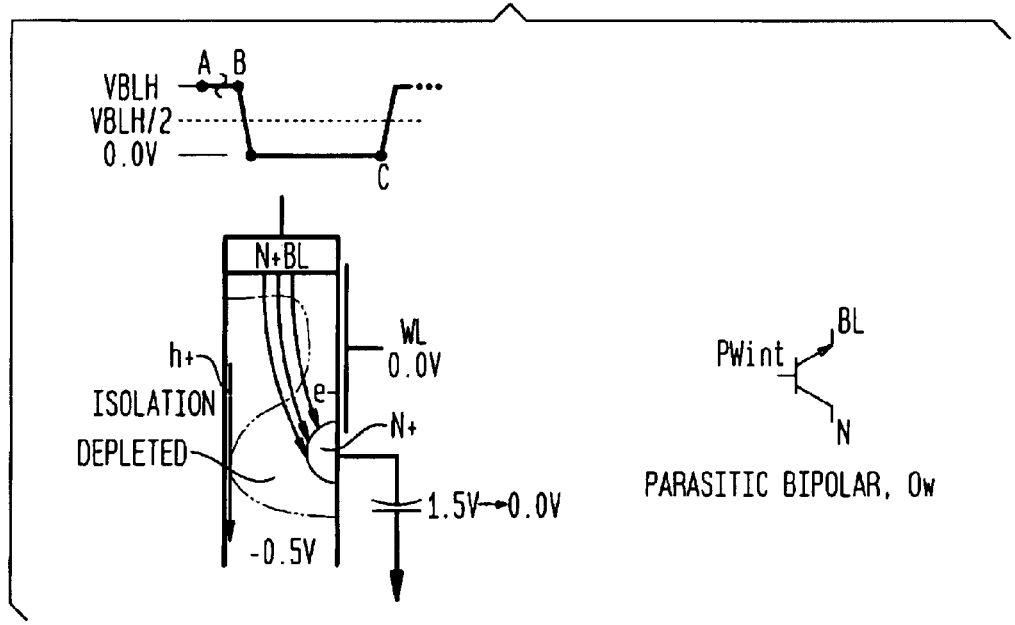
FIG. 1 is a schematic that explains the floating-well effects in a conventional hybrid memory cell.
Figure 2:
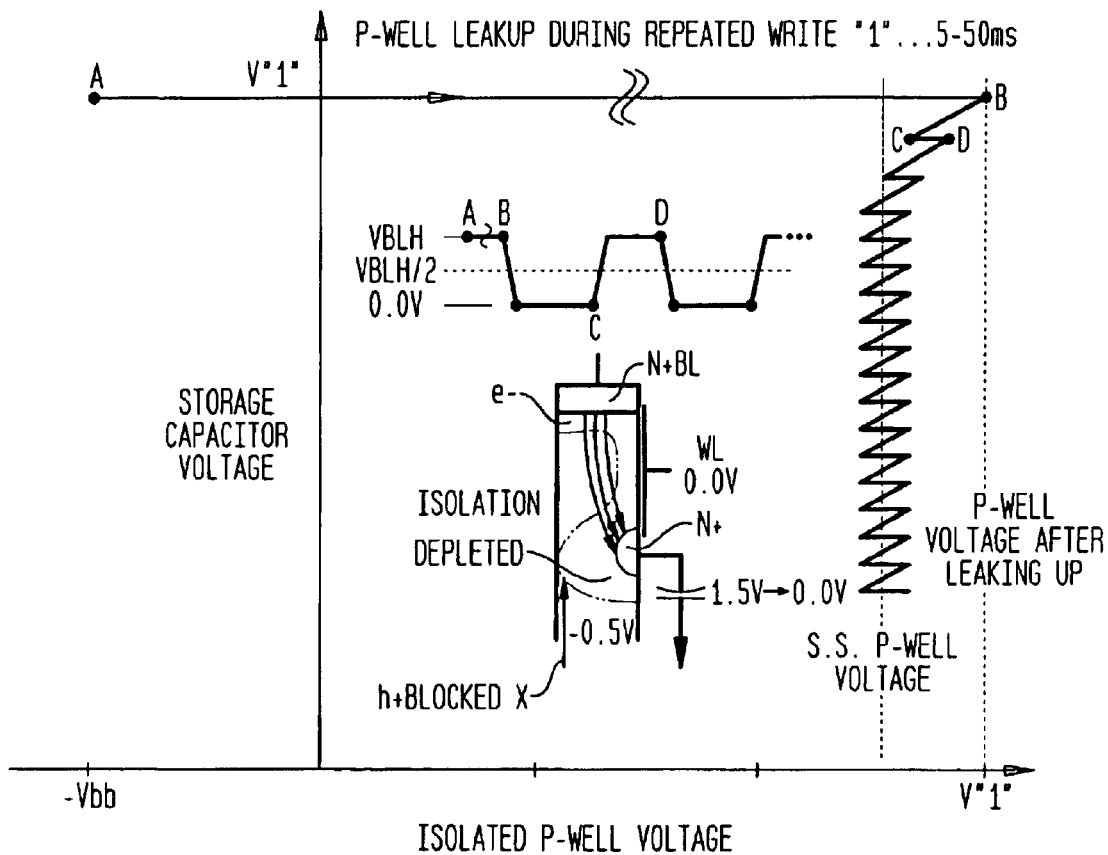
FIG. 2 is an illustration of storage capacitor charge loss with repeated bitline cycling in an unselected conventional hybrid memory cell.
Figure 3:
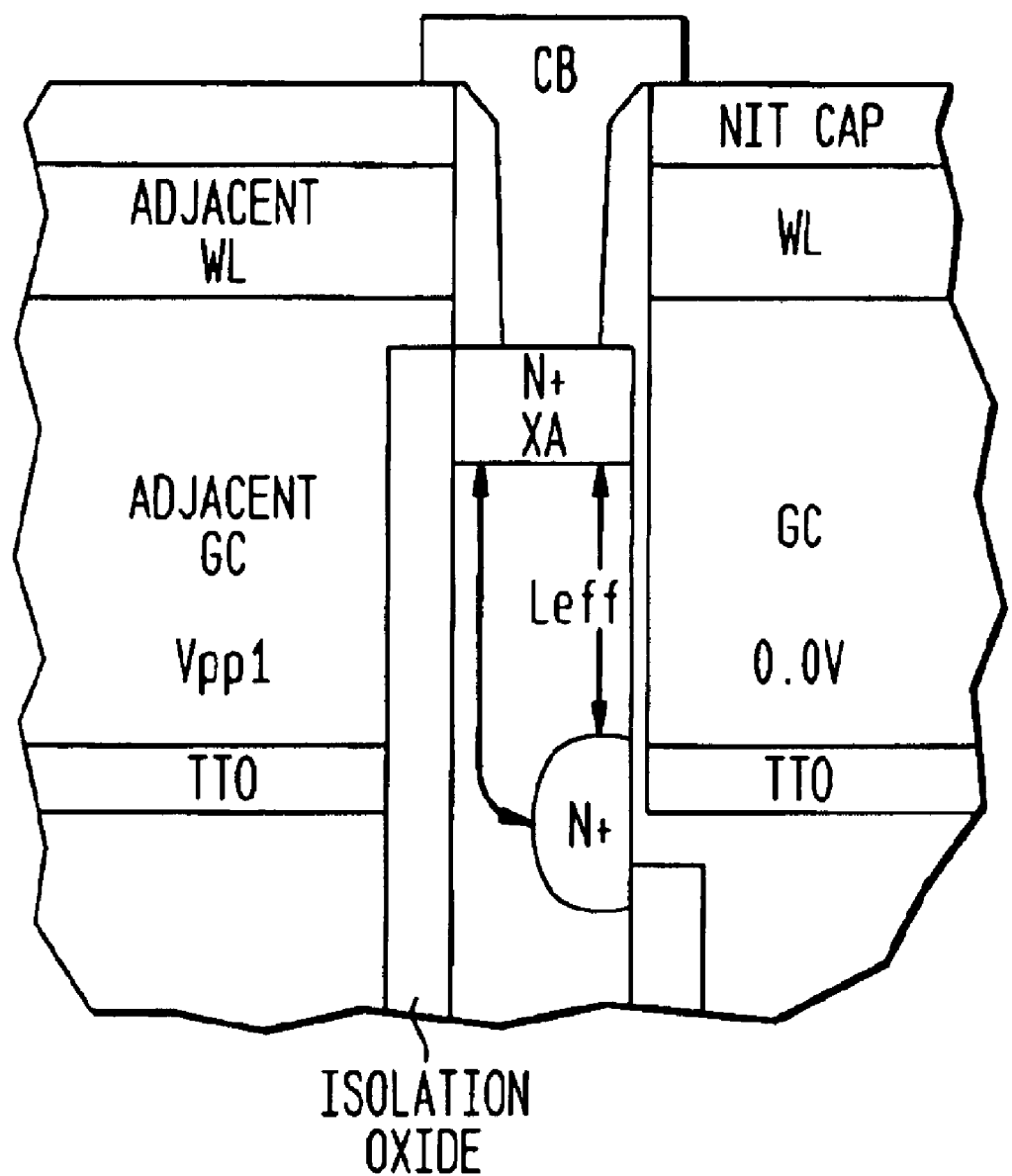
FIG. 3 is an illustration of the backside leakage problem of a prior art memory cell.

The present invention which provides a method of fabricating a memory cell which includes at least double-gated vertical MOSFETs and isolation regions that are self-aligned to the wordlines and bitlines of the cell will now be described in greater detail by referring to FIGS. 4–14 which accompany the present application. It is noted that in the accompanying drawings, like and corresponding elements are referred to by like reference numerals.

Figure 4:
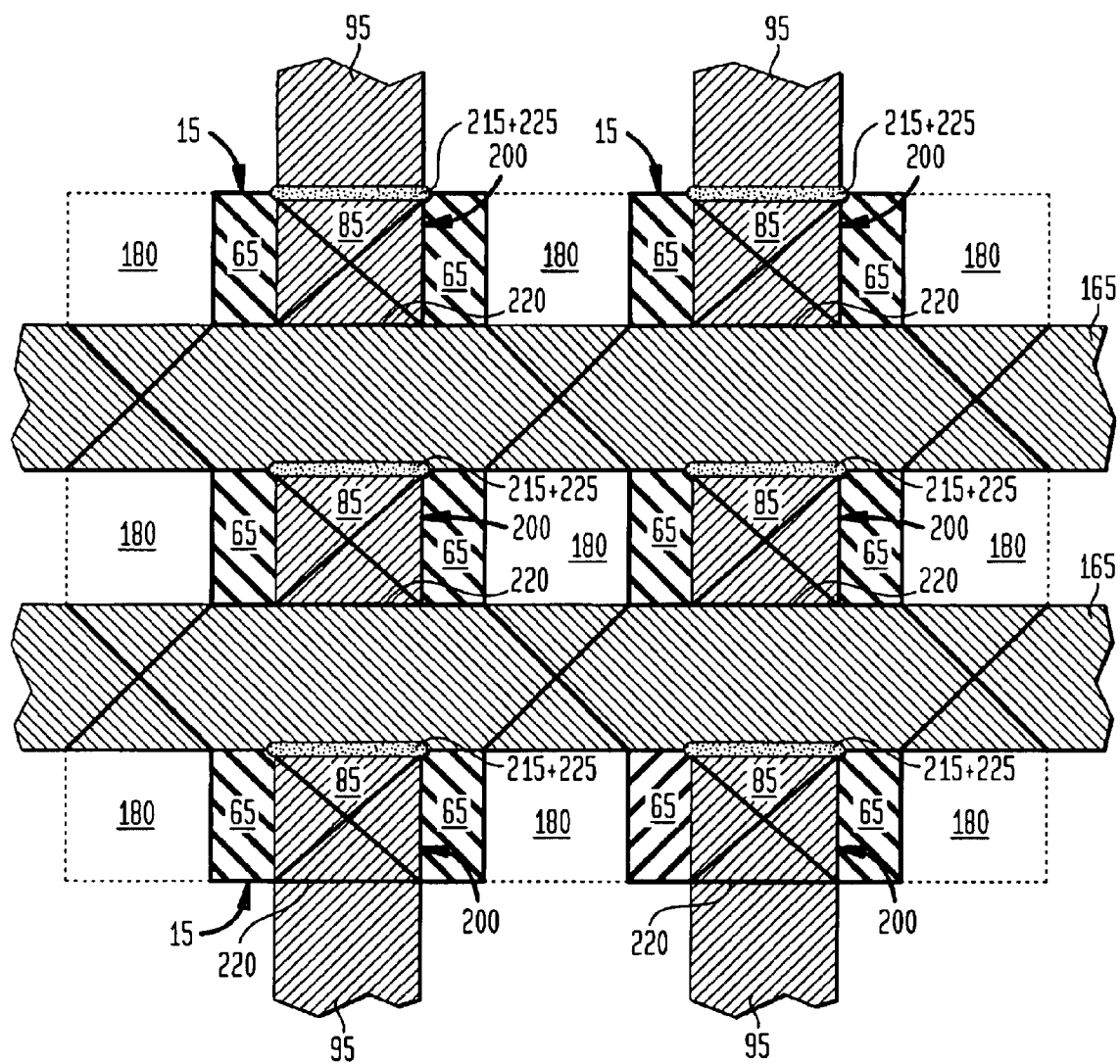
FIG. 4 is an illustration of the inventive memory cell which includes at least double-gated vertical MOSFETs and isolation regions that are self-aligned to the wordlines and bitlines of the cell.
Figure 5A:
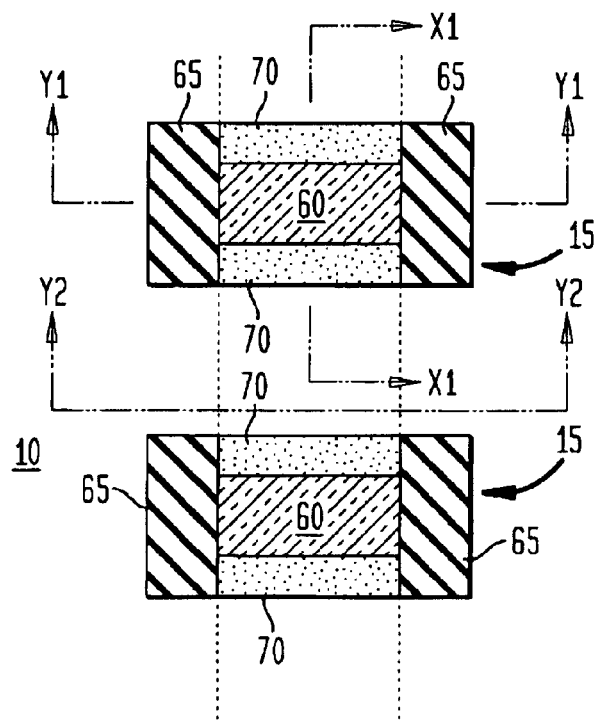
FIGS. 5–14 are pictorial views illustrating the inventive memory cell through various processing steps of the present invention.
Figure 5B:
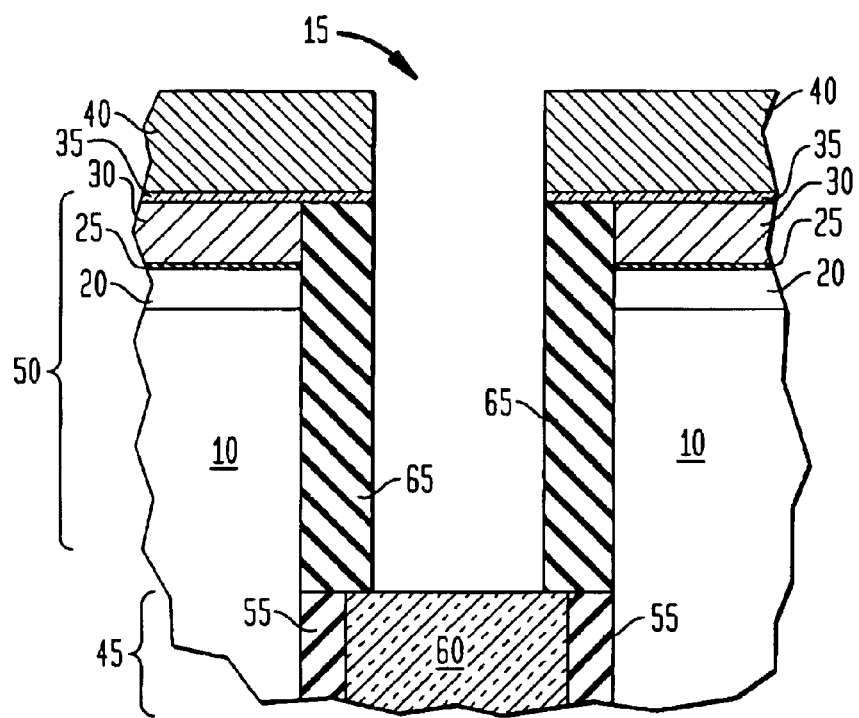
Figure 5C:
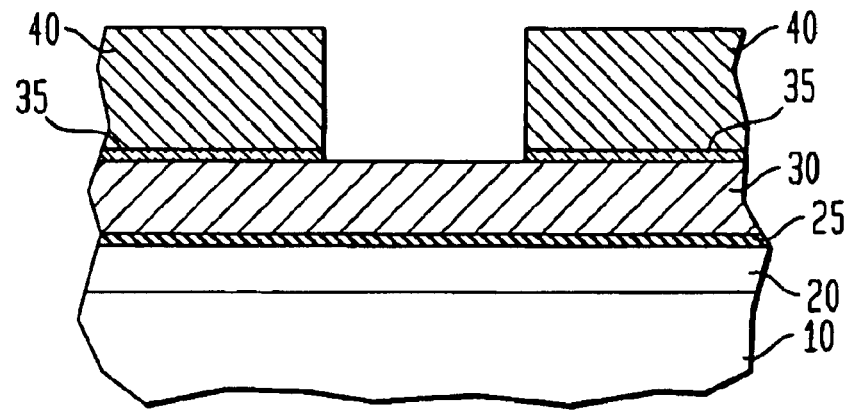
Figure 5D:
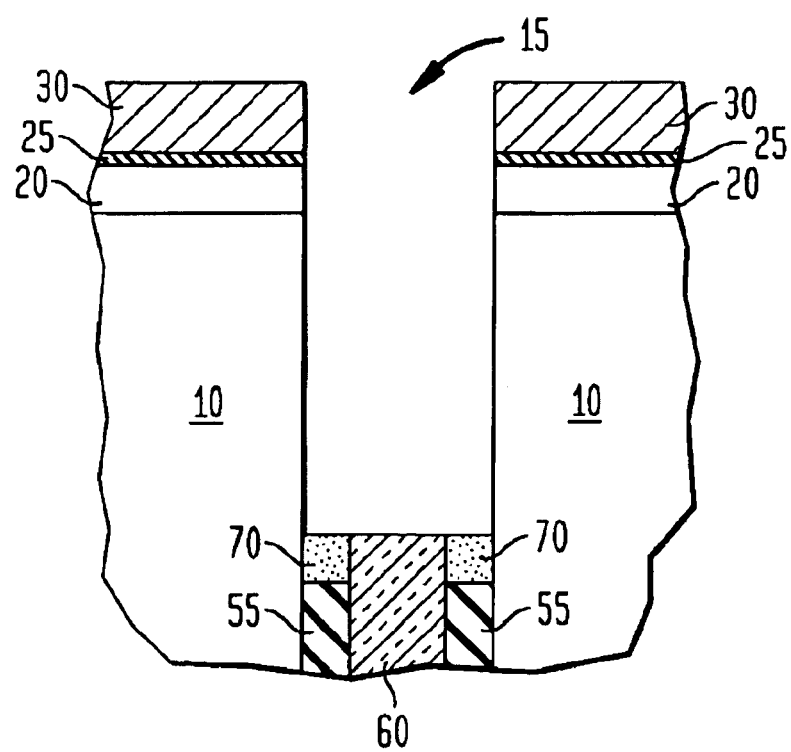
Figure 6A:
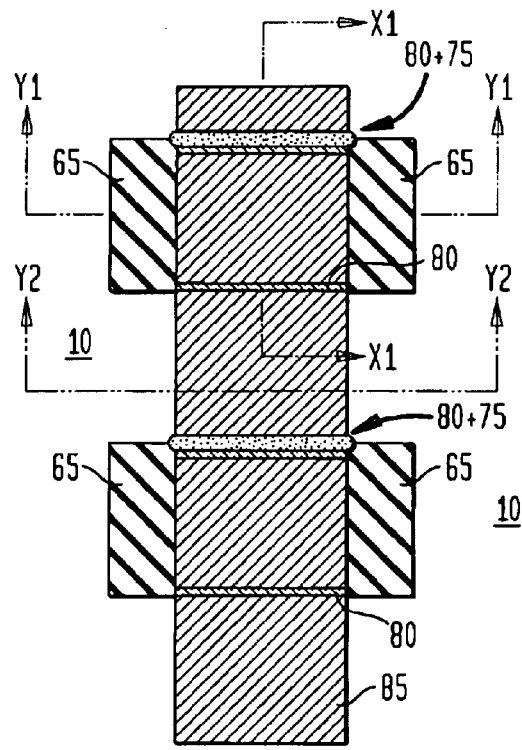
Figure 6B:
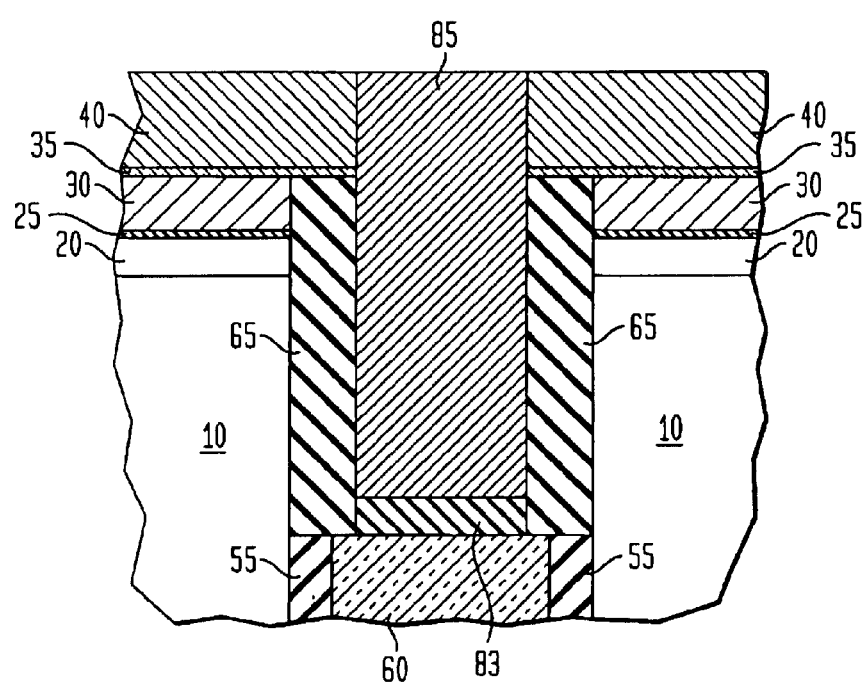
Figure 6C:
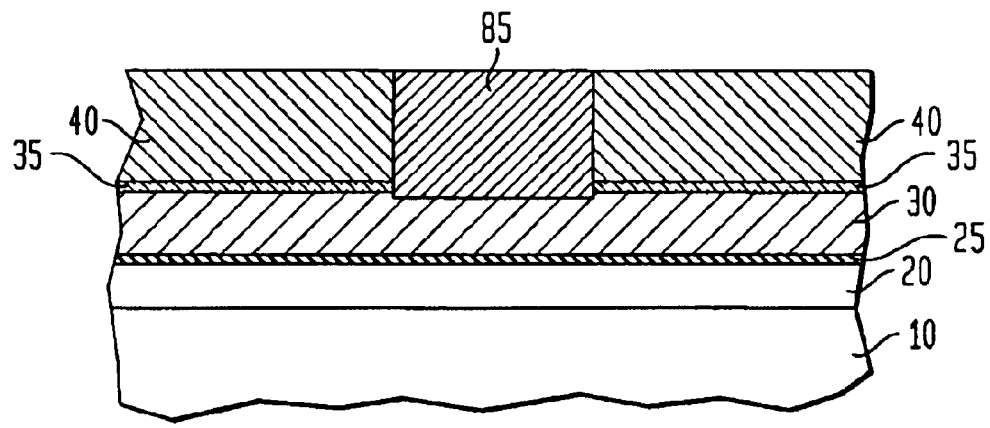
Figure 6D:
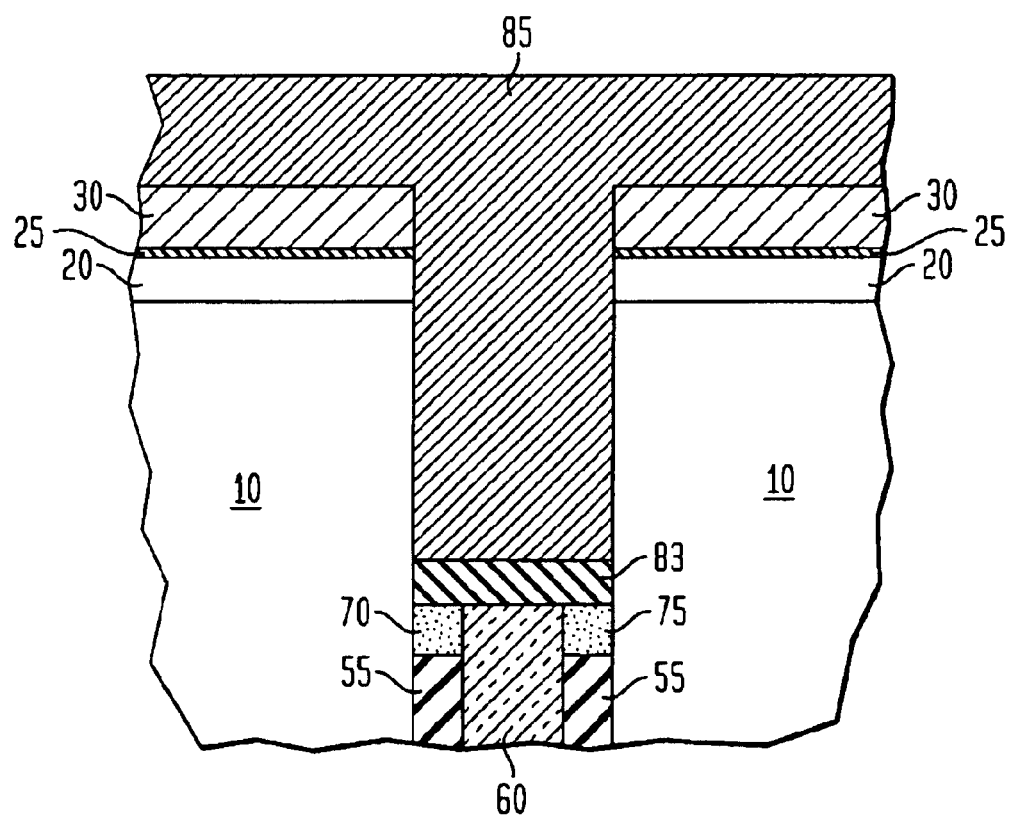
Figure 7A:
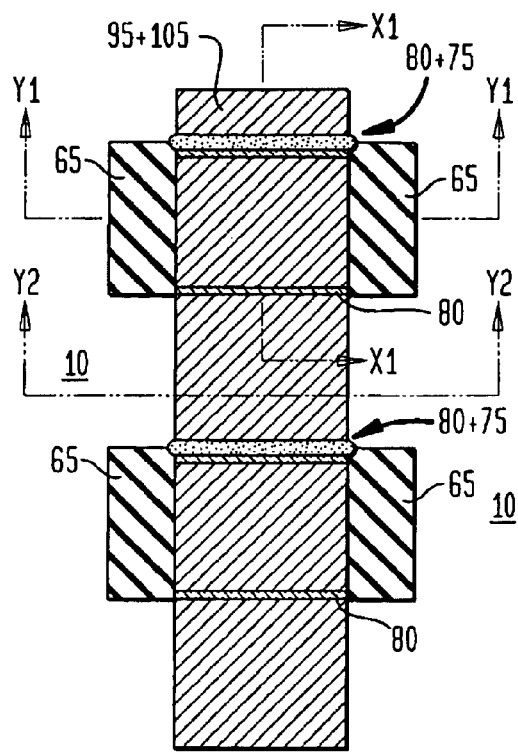
Figure 7B:
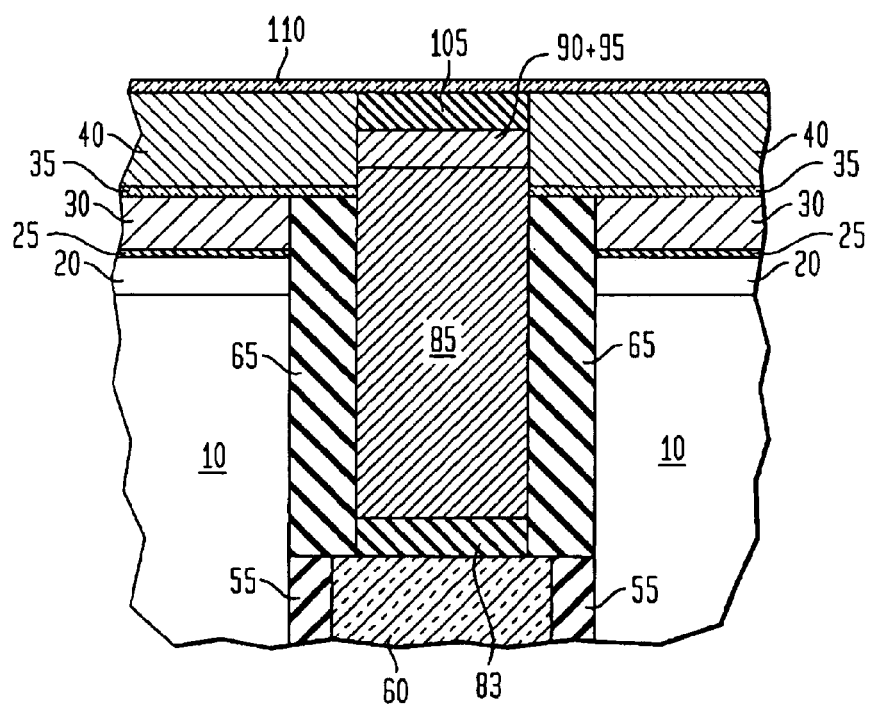
Figure 7C:
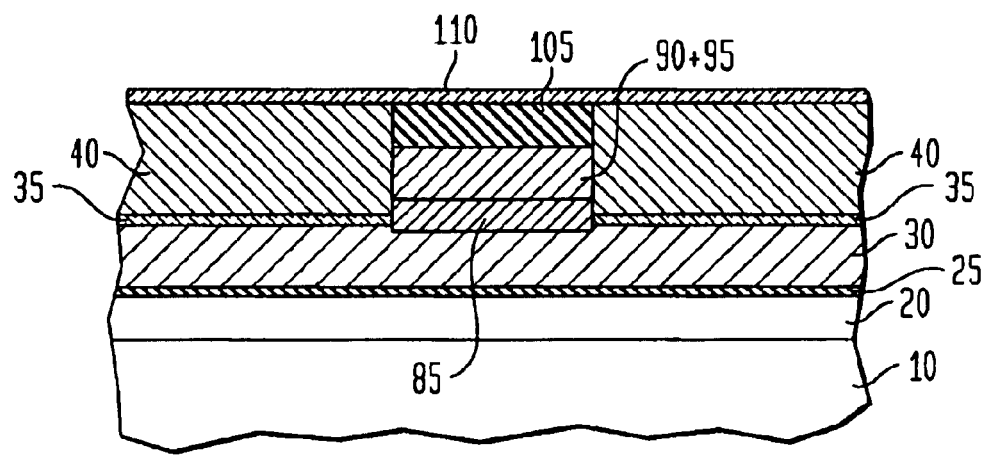
Figure 7D:
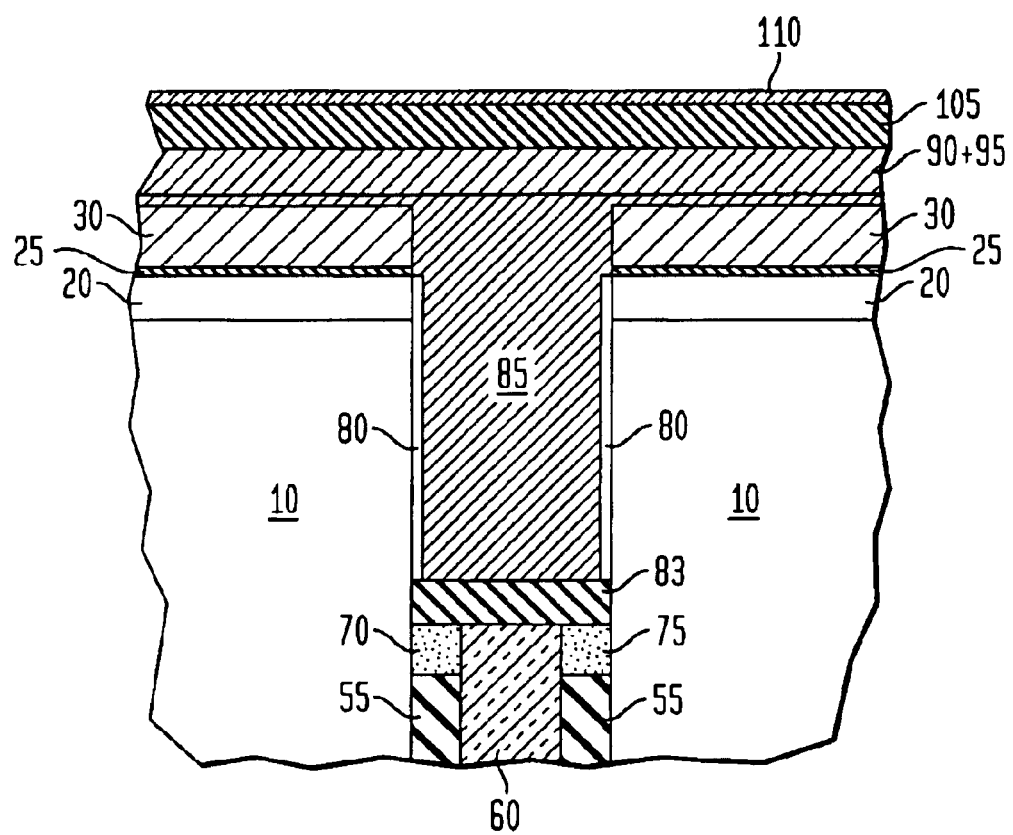

Reference is first made to FIG. 4 which is pictorial representation (Top view) of the inventive memory cell of the present invention. Specifically, the inventive memory cell of the present invention includes a plurality of memory cells 200 which are arranged in rows and columns. It is noted that in this figure only the array portion of the inventive cell is shown; the support portion of the memory cell is not shown for clarity. Each memory cell includes a vertical metal oxide semiconductor field effect transistor (MOSFET) having exposed gate conductor regions 85 and gates (215, 220) that are formed on opposing sidewalls of said MOSFET, wherein one of the opposing sidewalls also includes confined buried-strap 225. Note the sidewalls containing both gate and buried-strap are located within adjacent deep trenches. The memory cell of FIG. 4 also includes a plurality of wordlines 95 formed over the vertical MQSFETs and in contact with exposed gate conductor regions 85; as shown, wordlines 95 are arranged in columns. The inventive memory cell also includes a plurality of bitlines 165 that are orthogonal to wordlines 95; and trench isolation regions 180 formed adjacent to rows of memory cells. In accordance to the present invention, the trench isolation regions have a depth that is deeper than abutting bitline diffusion regions (not shown in this view).

As is shown, the wordlines run in the y-direction over the middle of the deep trenches and contact the array gate conductors. Thus, the active area of each vertical MOSFET is gated on both the front and back sides by the same wordline; eliminating the adjacent wordline backgating problem of prior art cells. The front-gated side (top end of the DT in FIG. 4) contains both a gate dielectric and a strap; and the back-gated side (bottom of the deep trench in FIG. 4) contains only a gate dielectric. Note the regions of mandrel oxide 65 shown on the ends of the deep trench which serve to cut the strap, resulting in a confined strap which prevents node-to-node leakage in the bitline direction.

Bitline conductors run in the x-direction between deep trenches and are in electrical contact with silicon upon which they lie. Both wordlines and bitlines are capped by an insulating layer such as an oxide which serves as an etch mask for the isolation regions in the array. The isolation regions in the array are formed by etching silicon selective to the capping material and to oxide. The isolation regions are etched to a depth which is slightly deeper than the bitline diffusion regions, allowing continuity to the upper portion of the well and avoiding floating-well conditions.

As is illustrated in FIG. 4, the bitlines and wordlines are rotated by 90° relative to prior art memory cells. An exemplary wordline in the inventive layout results in the simultaneous gating of both the front and back gates by that wordline; thus, activation of an adjacent wordline does not directly gate the backside of the array MOSFET.

The inventive wordline scheme results in a double-gated vertical MOSFET for the DRAM transistor. It is recognized by those skilled in the art that double-gated MOSFETs (from planar MOSFET and surround-gate devices) exhibit much stronger gate control, leading to increased on-current, steeper sub-$V_t$ slope, reduced substrate sensitivity, and reduced short-channel effects (DIBL), than observed on conventional single-sided gated MOSFETs of comparable physical dimensions. The channel length of the vertical MOSFETs in the inventive cell may be further reduced since DIBL is reduced which leads to even more on-current. It is noted that in the present invention the distance between adjacent deep trenches is minimized in the wordline direction. This is opposite to current technology wherein the objective is to increase the distance between deep trenches. By minimizing the distance between adjacent deep trenches, the inventive memory cell can operate in a fully depleted state.

The processing scheme, which is employed in the present invention in fabricating the above-described memory cell, will now be described in more detail by referring to FIGS. 5–14 which illustrate the various processing steps of the present invention. As stated above, top views are shown as well as cross-sectional views through various cuts including the deep trench region, Y1—Y1, and through the region between rows of deep trenches, Y2—Y2. In some instances, a cut through the deep trench and vertical MOSFET body regions, X1—X1, is also shown.

Reference is first made to FIGS. 5A–D which illustrate a portion of the inventive memory cell (array region) following collar divot fill with a strap placeholder material. Specifically, the structure shown in FIGS. 5A–D comprises a Si-containing substrate 10 having at least one deep trench 15 formed therein. The term "deep trench" is used herein to denote a trench whose depth from the top surface of the Si-containing substrate is from about 1.0 μm or greater. The structure illustrated in FIGS. 5A–D also includes bitline diffusion regions 20 formed in the surface of the substrate, pad oxide 25 formed over the bitline diffusion regions, first pad nitride layer 30 formed on the pad oxide layer, oxide etch stop layer 35 formed on said first pad nitride layer and second nitride pad layer 40 formed on the oxide etch stop layer. It is noted that the deep trench is formed through the various materials layers mentioned above stopping at a predetermined depth in the Si-containing substrate; thus the various materials layers abut the deep trench region.

The deep trench region includes a lower region (not shown), middle region 45, and an upper region 50. The lower region is the portion of the deep trench in which the capacitor element (i.e., storage capacitor) of each individual memory cell is formed, while the upper region of the deep trench is the portion of the deep trench in which the double-gated vertical MOSFET of each individual memory cell is formed. Middle region 45 is located between the capacitor and MOSFET of the each individual memory cell.

The middle region of the deep trench includes collar oxide regions 55 that are formed on exterior sidewalls of the deep trench and deep trench polysilicon 60 formed between the collar oxide regions. The collar oxide regions include a divot that is filled with a strap placeholder material 70. The upper portion of the deep trench, at this point of the inventive method, includes oxide mandrels 65 which are formed on the sidewalls of the upper trench region.

The structure shown in FIGS. 5A–D is formed utilizing the following processing steps and materials. First, pad oxide 25 having a thickness of about 5 nm or less is thermally grown on the surface of Si-containing substrate 10 and thereafter bitline diffusion regions 20 are implanted into the Si-containing substrate utilizing conventional implantation processes well known to those skilled in the art. First nitride pad layer 30 having a thickness of from about 10 to about 100 nm is then deposited on the pad oxide layer utilizing conventional deposition processes such as chemical vapor deposition (CVD) and plasma-assisted CVD that are well known to those skilled in the art. Following the formation of the first nitride layer, an optional hard mask (not shown in the drawings) may be formed on the first nitride layer.

Deep trenches 15 (one of which is shown in FIGS. 5A–D) are the formed in the customarily manner of opening a trench pattern extending through the first nitride layer, the pad oxide layer, the bitline diffusion regions and a portion of the Si-containing substrate via lithography and anisotropic etching. The deep trenches which are formed in rows and columns into the surface of the Si-containing substrate are the areas in which the inventive double-gated vertical MOSFETs are formed. A polysilicon buffered LOCOS (local oxidation of silicon) collar or other like collar oxide is then formed in a portion of the deep trench. Next, a capacitor (not shown in the drawings) is formed in the lower portion of the deep trench utilizing conventional deep trench capacitor processing steps that are well known to those skilled in the art. Included in the deep trench capacitor processing steps is the formation of a buried plate diffusion region (not shown), and the formation of a node dielectric (not shown) about said buried plate diffusion region. The deep trench is then filled with deep trench polysilicon 60 and planarized utilizing a conventional planarization process such as chemical-mechanical polishing (CMP). The deep trench polysilicon is recessed by conventional means to a depth which is desired for the strap (determines the channel length of the double-gated vertical MOSFET; typically of from about 100 to about 400 nm). A layer of oxide such as high-density plasma (HDP) oxide or CVD oxide which subsequently is formed into mandrel oxide regions 65 is deposited to a thickness which completely fills the opening above the recessed deep trench polysilicon and thereafter the layer of oxide is planarized to first nitride pad layer 30.

Next, a thin etch oxide etch stop layer 35 having a thickness of from about 5 to about 20 nm is deposited by conventional means such as CVD and second nitride layer 40 is then deposited by a conventional deposition process such as CVD. The first and second nitride layers may be composed of the same or different nitride containing material. For example, the first and second nitride layers may be both composed of SiN.

A mandrel stripe removal mask (not shown) having a predetermined pattern formed thereon is then formed on the second nitride layer and a conventional etching process is employed to open the second nitride layer stopping on the oxide etch stop layer. The etching process used during this step of the present invention has a high-selectivity for removing nitride as compared to oxide. An example of such an etching process is reactive-ion etching (RIE).

After opening the second nitride layer, the exposed oxide etch stop layer is removed as well as underlying portions of the HDP or CVD oxide layer utilizing an etching process that has a high-selectivity for removing oxide as compared to nitride or polysilicon. It is noted that during this etching step mandrel oxide regions 65 are formed on the upper sidewalls of the deep trench region and etching is stopped on deep trench polysilicon 60.

The oxide etching mentioned above continues so as to form divots in exposed portions of the collar oxide. The divots are then filled with a nitride material so as to form collar divots 70 that are filled with a strap placeholder material.

Following the formation of the collar filled divots in the deep trench, a masked or maskless one-sided strap (OSS) process is employed to etch a collar filled divot from one side of the deep trench wherein a confined buried-strap is to be formed. After etching one side of the deep trench, the divot is filled with strap polysilicon 75.

Next, a trench top oxide (TTO) 83 is formed on all horizontal surfaces including deep trench polysilicon and divot filled collar oxide regions utilizing conventional deposition processes and thereafter a conventional resist recess process is employed to remove the trench top oxide from top surfaces of the structure. A sacrificial oxide layer (not shown) is next formed and stripped utilizing conventional lithography and etching and gate dielectric 80 such as an oxide is formed on the exposed vertical sidewalls of the upper portion of the deep trench. The gate dielectric is formed in the present invention utilizing any well-known process such as thermal oxidation of silicon or by nitridation of an oxide. Alternatively, a deposited gate dielectric, such as by CVD, may be formed. A gate conductor material 85 such as doped polysilicon is then formed on the gate dielectric and the structure is planarized to the second nitride layer forming the structure shown in FIGS. 6A–D.

After planarizing the gate conductor, the gate conductor is recessed utilizing a conventional recessing process and diffusion barrier 90 such as WN is formed on the recessed gate conductor utilizing a conventional deposition process. Next, a highly conductive metal 95 such as W is deposited on the diffusion barrier utilizing a conventional deposition process, the deposited conductive material is planarized and recessed and a capping layer 105 is formed on the recessed conductive material. The capping layer is composed of any insulator material such as an oxide. It is noted that the recessed highly conductive material forms wordlines 95 of the memory cell. Thus, reference numeral 95 is used to describe both the highly conductive material and the wordlines. Following capping of the wordlines, an etch stop protect layer 110 such as SiN is deposited on the entire surface of the structure including supports region and array region. It is noted that up until this point of the present method, the array MOSFET was being fabricated; See FIGS. 7A–D.

Figure 8:
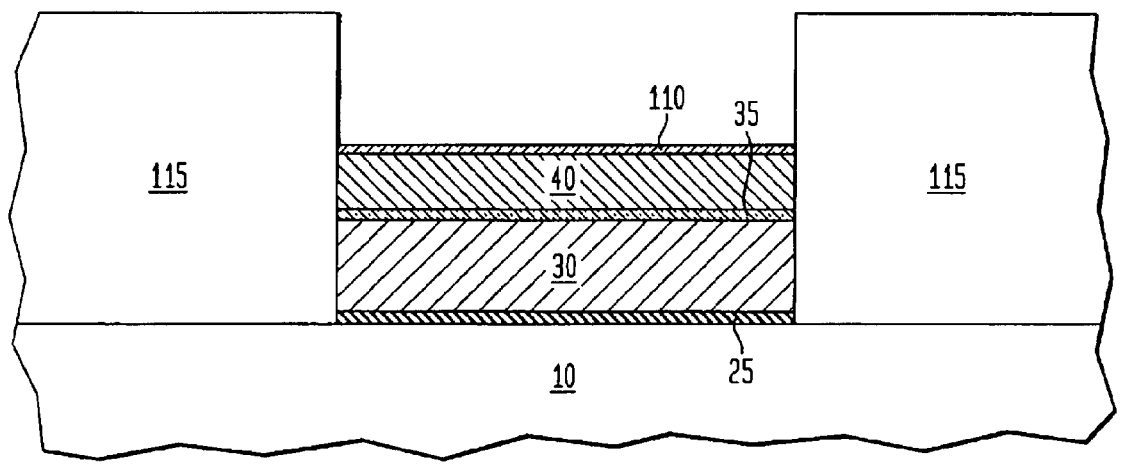
Figure 9:
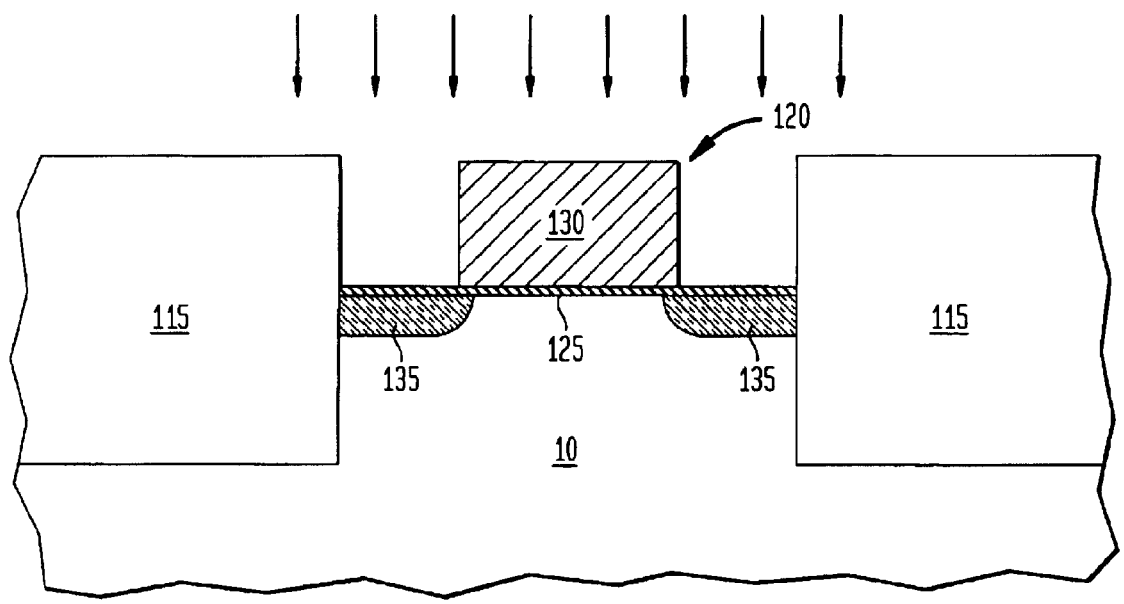

After protecting the array MOSFET, the support MOSFETs are now fabricated. Specifically, as shown in FIG. 8, the support isolation trench regions 115 are first formed and thereafter (See FIG. 9) support MOSFETs 120 are formed. The support isolation trench regions are formed by first patterning the active area in the support region utilizing a conventional lithography step. The pattern is then opened forming trenches in the structure which extend to the Si-containing substrate. An oxidation process is then performed, the trenches are filled with an oxide material and the oxide fill is planarized to the etch stop protect layer formed above.

The support MOSFETs are then formed as follows: A block mask (not shown) is formed on the structure to open etch stop protect layer 110, second nitride layer 40, oxide barrier and pad nitride layers to the pad oxide in the supports. Next, a conventional well implant is employed through the pad oxide layer and thereafter the pad oxide is stripped from the supports region. A gate dielectric 125 such as an oxide, nitride or oxynitride is formed by a conventional thermal oxidation or nitridation process and the support gate conductor 130 is deposited and planarized to isolation trench regions 115. The support gate conductor is thereafter patterned (by conventional lithography and etching) so as to strip support polysilicon from array selective to nitride. The patterned gate conductor is thereafter subjected to a conventional gate sidewall oxidation process and ion implantation processes are employed in doping the gate conductor and forming source/drain regions 135 in the supports region, See FIG. 9.

Figure 10:
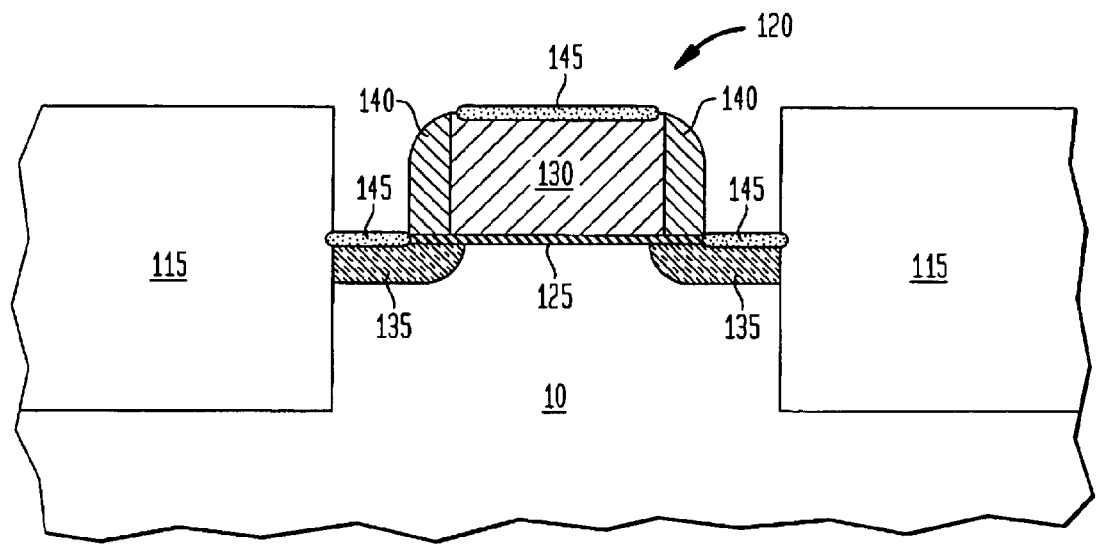

FIG. 10 shows the supports region after sidewalls spacers 140 are formed on the gate conductor and after a conventional salicidation process is employed. The sidewall spacers are composed of a conventional insulating material such as SiN and are formed by deposition and etching. The salicidation process forms salicide regions 145 on the top of the gate conductor as well as surfaces of the Si-containing support that overlay the source/drain regions.

Figure 11:
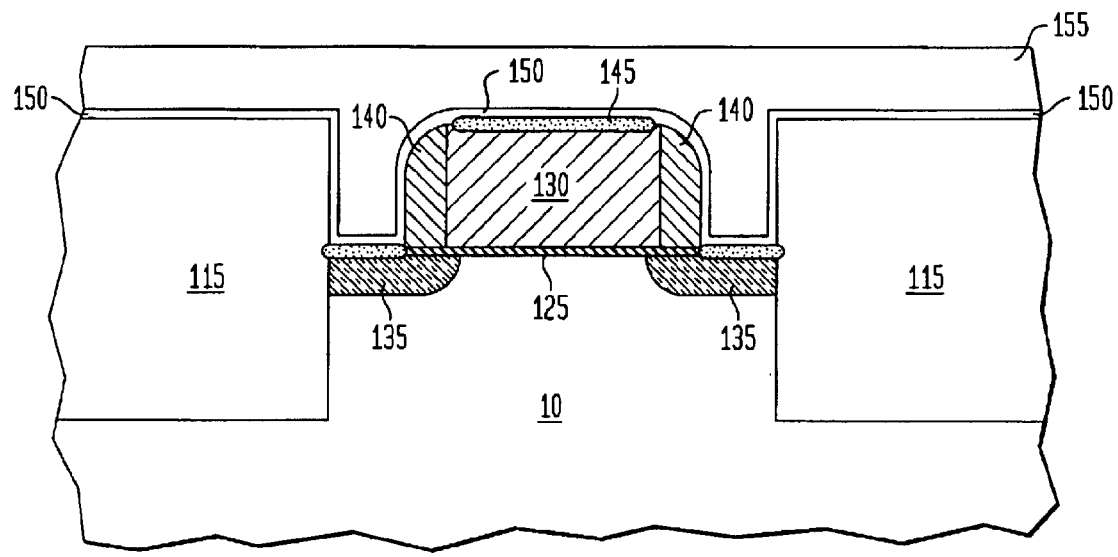
Figure 12A:
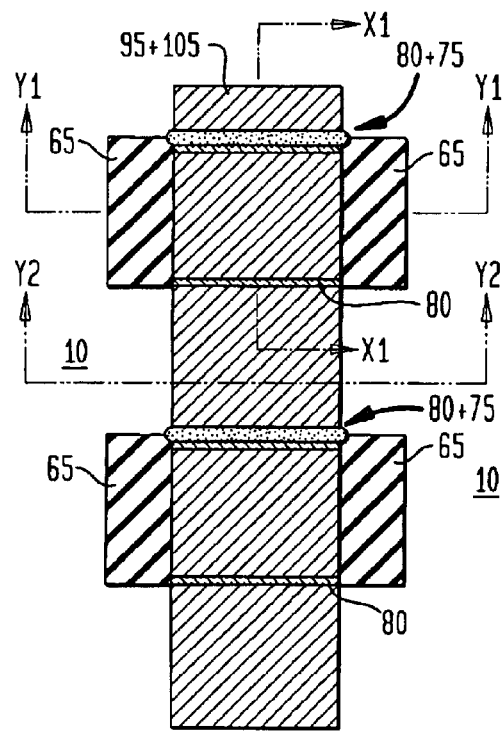
Figure 12B:
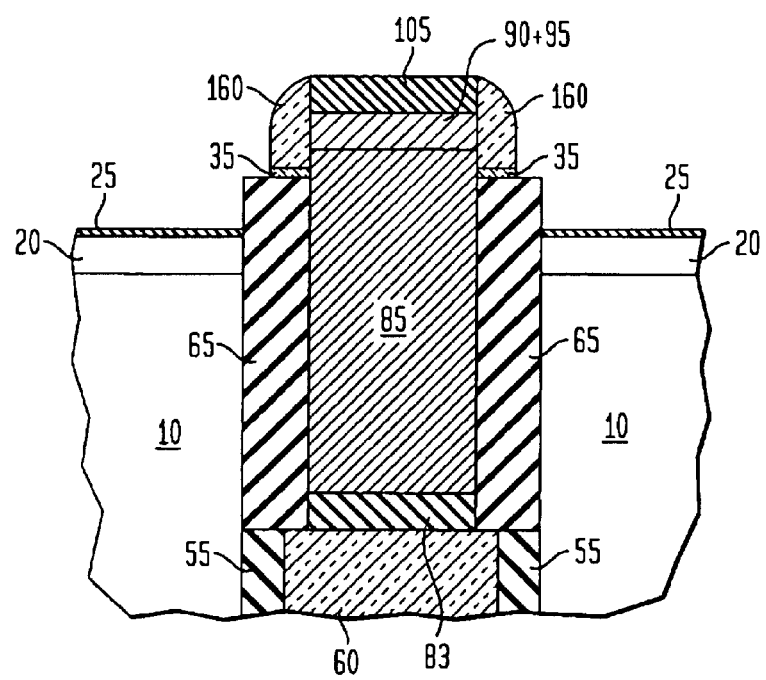
Figure 12C:
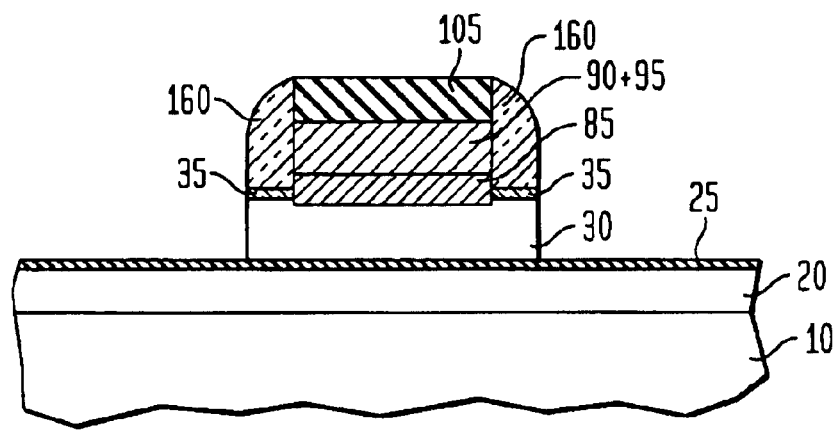
Figure 12D:
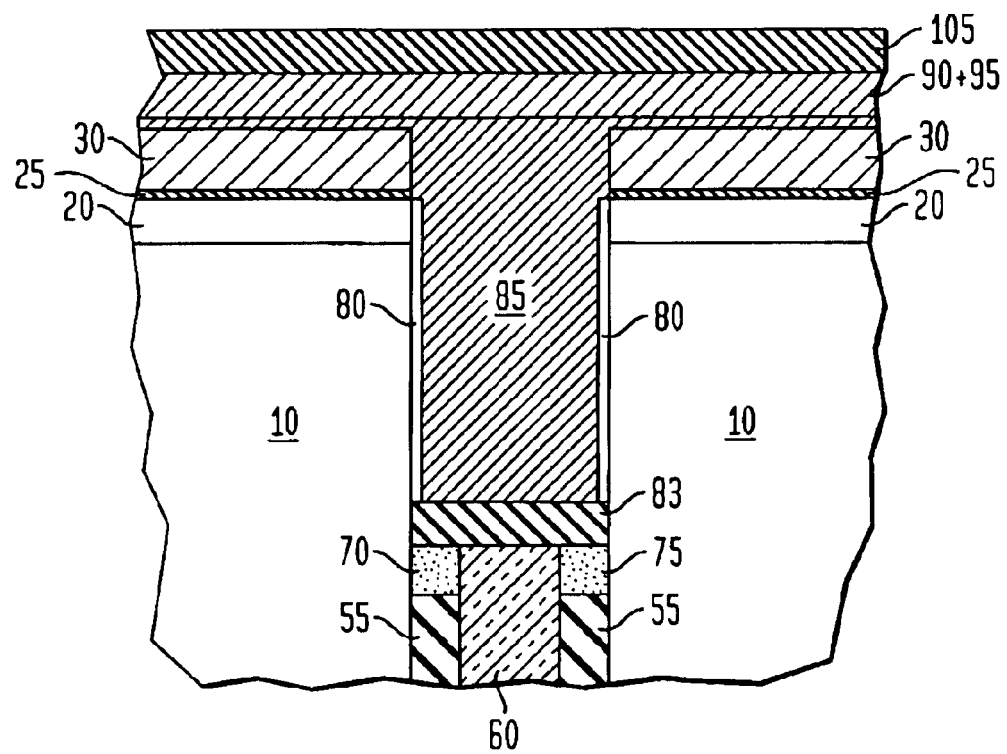
Figure 13A:
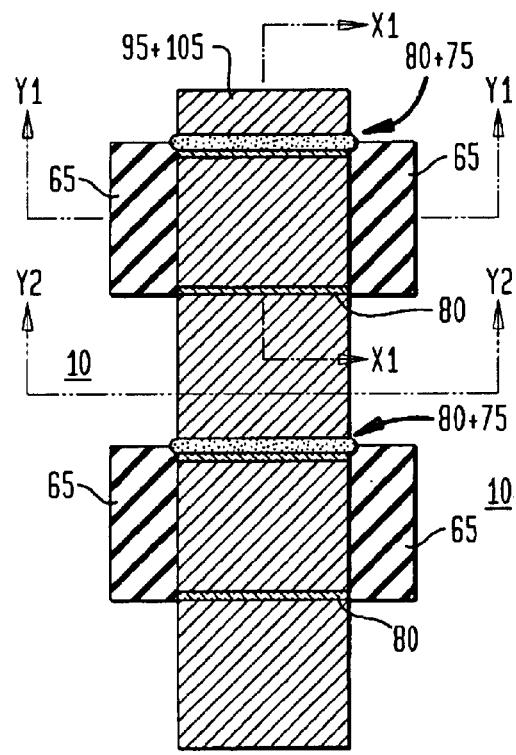
Figure 13B:
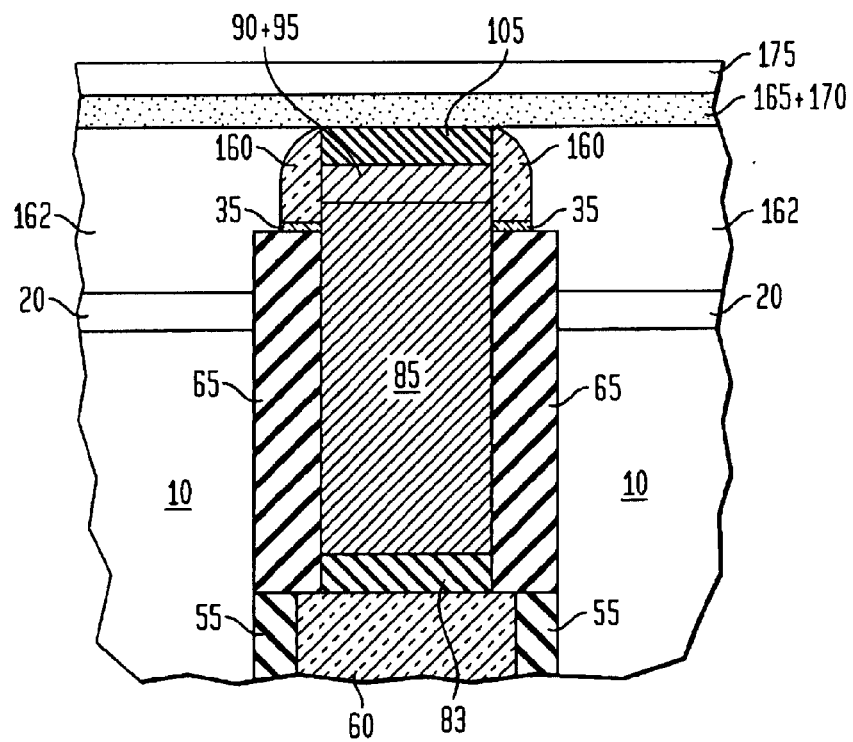
Figure 13C:
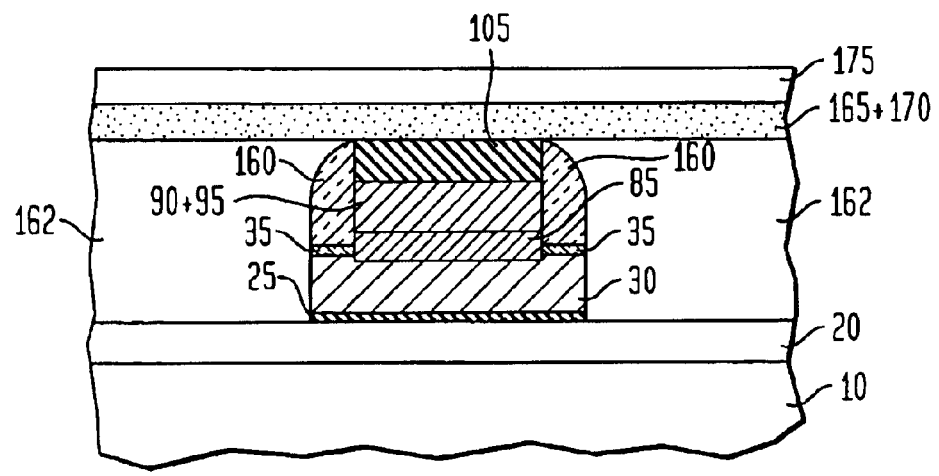
Figure 13D:
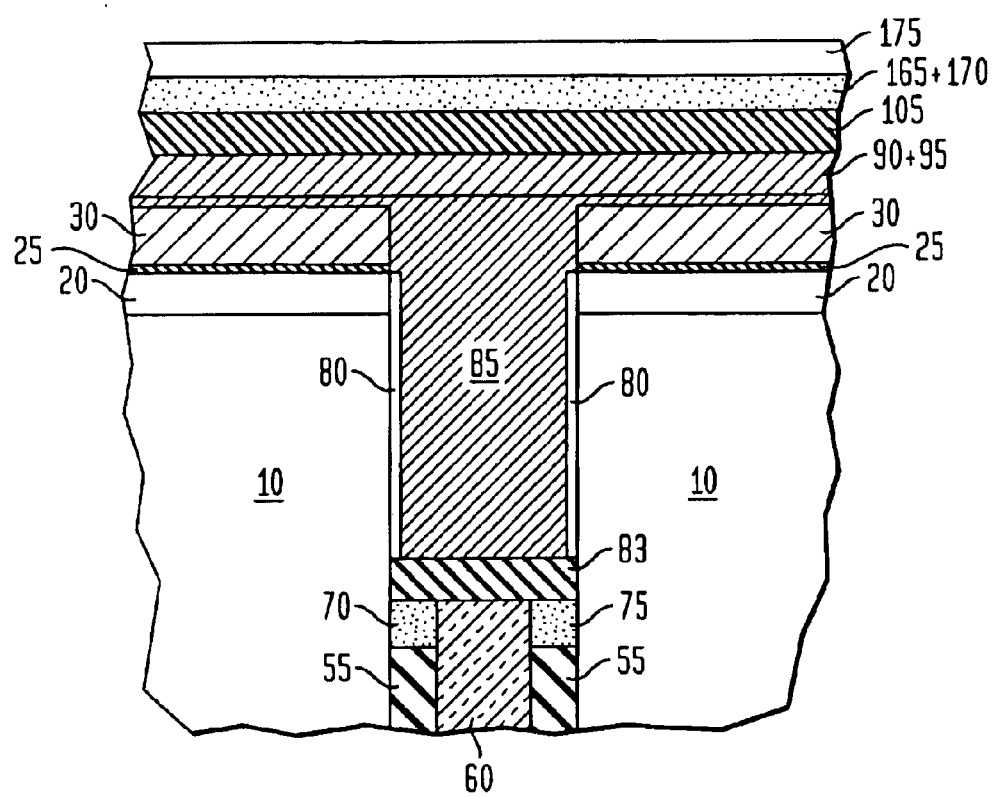
Figure 14A:
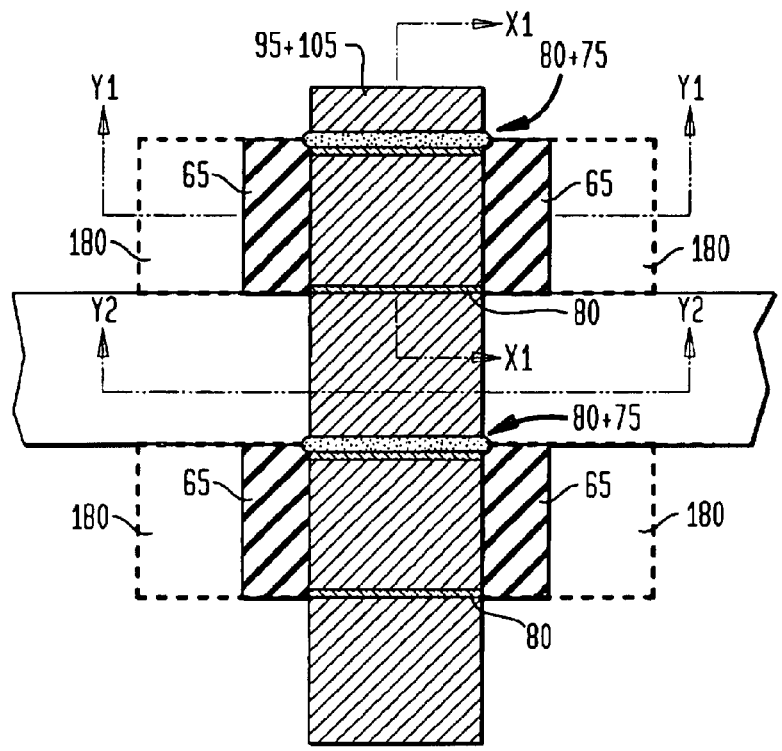
Figure 14B:
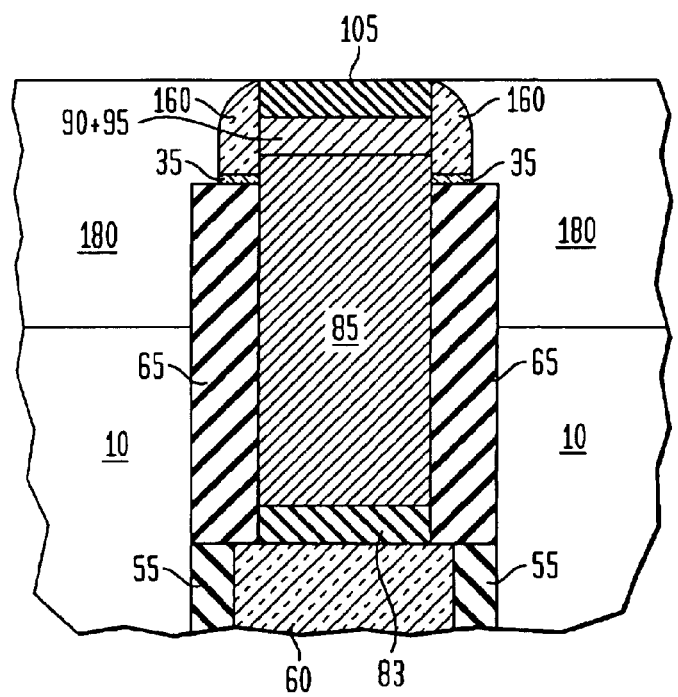
Figure 14C:
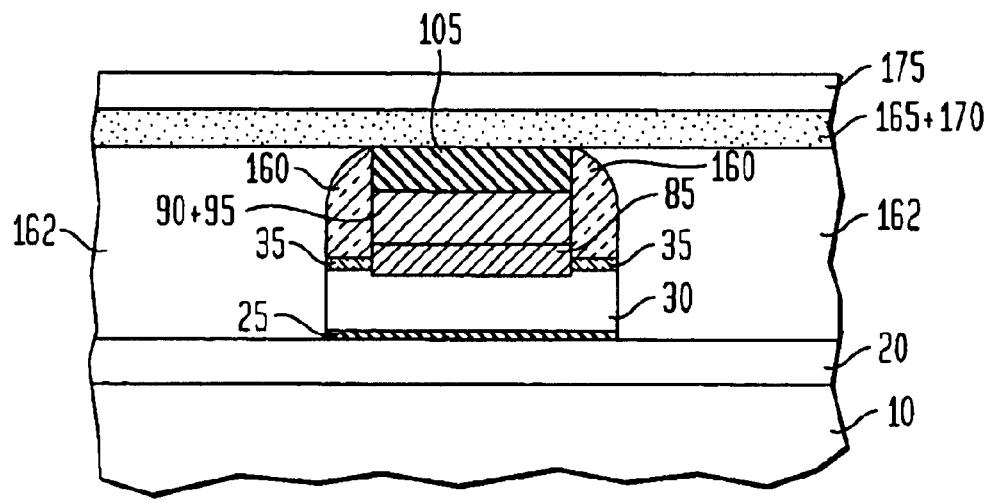
Figure 14D:
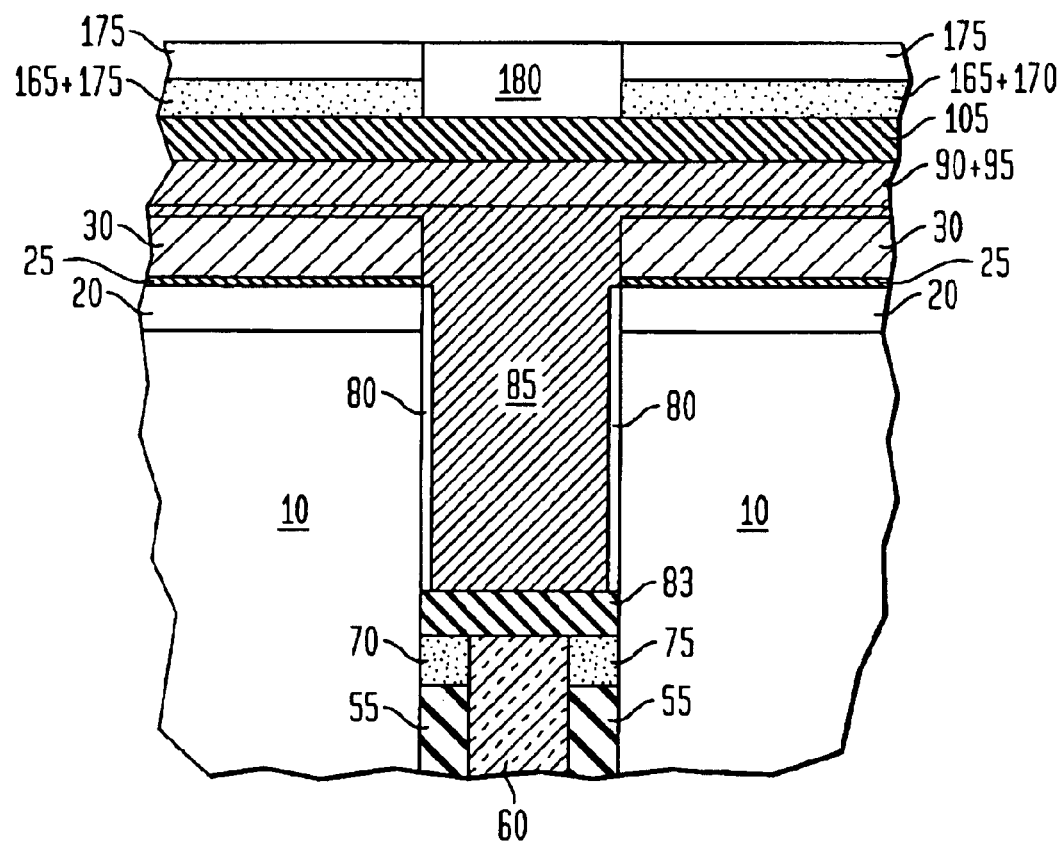

FIG. 11 shows the supports region after deposition of a thin nitride layer 150 and an ionic contamination protect layer 155 such as boron doped silicate glass (BPSG) and planarization. FIG. 11 shows the completed support MOSFET (120) that is formed in the present invention.

After formation of the supports MOSFET, the array processing is resumed. Specifically, the ionic contamination protect layer and nitride layer formed in FIG. 11 are removed in the array region, while protecting the supports MOSFET with a block mask. Any conventional etching process which is capable of removing the ionic contamination protect layer and the nitride layer while stopping on the etch stop protect layer can be employed in the present invention.

Next, etch stop protect layer 110 and second nitride layer 40 are removed selective to oxide in the arrays utilizing a conventional etching process. A CVD oxide layer is then deposited by conventional means and etched to form oxide spacers 160. A conventional RIE process through nitride pad 30 selective to oxide and silicon is then performed providing the structure shown in FIGS. 12A–D.

The remaining pad oxide layer is then stripped from the array utilizing a conventional etching process that has a high selectivity for removing oxide as compared to silicon and then bitlines 165 are formed. Specifically, the bitlines are formed by first depositing a doped polysilicon layer 162 having the same conductivity as the bitline diffusion region on the Si surfaces of the memory cell that is adjacent to the array MOSFET. This doped polysilicon layer is formed utilizing a conventional in-situ deposition process or by deposition followed by ion implantation. The doped polysilicon layer is then planarized to oxide (removing any doped polysilicon from the supports) and a bitline barrier layer 170 composed of WN or other like diffusion barrier material is formed. Next, W or WSi$_x$ (hereinafter referred to as bitline 165) is deposited on the bitline barrier layer and oxide cap 175 is formed on the bitline. The structure fabricated from these steps of the present invention is shown in FIGS. 13A–D.

After formation of the bitline conductor stack over the bare silicon, the oxide cap is patterned into bitline stripes. The bitline stripes are used as a mask and a conventional etching process selective to oxide is conducted through bitline 165, bitline barrier 170, doped polysilicon 162 and Si-containing substrate 10. Oxide capping layer 105 over the wordline and oxide spacers 160 on the sidewalls of the wordlines, in addition to patterned oxide cap 175, forms the hardmask for the subsequent isolation trench etch. In accordance with the present invention, this etching process is such that the Si is recessed beneath the depth of the bitline diffusion region. It is noted that this recessed area is the area in which the array isolation regions 180 will be subsequently formed. The recess area is this filled with an oxide material and planarized to the oxide-capping layer forming array isolation regions 180, See FIGS. 14A–D.

Insofar as the above-described method is concerned, the inventive method fabricates a novel memory cell utilizing a novel concept of defining the array shallow trench isolation areas using already formed wordlines and bitlines as etch masks, thus resulting in array isolation which is self-aligned to the wordlines and bitlines. Furthermore, processing of the support MOSFET is carried out after all array hot processing steps and is decoupled from the array processing. This aspect of the present invention allows for reduced thermal budget to be seen by the supports which is advantageous for forming high-performance dual workfunction support MOS-FETs. The inventive method also uses litho-friendly line-space patterns for wordlines and bitlines. No separate active area (AA) mask is required in the array.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of forming a memory array comprising the steps of:
   (a) forming a plurality of deep trenches in a Si-containing substrate in an array portion of a memory cell, said plurality of deep trenches being arranged in rows and columns and including at least collar filled divot regions which are filled with a strap placeholder material;
   (b) forming double-gated vertical MOSFETs in said plurality of deep trenches, wherein said double-gated vertical MOSFETs include at least two gates on opposing sidewalls and exposed gate conductors, wherein one of said sidewalls also contains a buried-strap region;
   (c) forming wordlines overlaying said double-gated vertical MOSFETs and in contact with said exposed gate conductors, wherein said wordlines are formed in said column direction;
   (d) protecting said array portion of said memory cell;
   (e) forming support MOSFETs while said array portion is protected;
   (f) protecting said support MOSFETs;
   (g) forming sidewalls spacers on said double-gated vertical MOSFETs;
   (h) forming bitlines on said Si-containing substrate that are orthogonal to said wordlines; and
   (i) forming isolation trench regions into said Si-containing substrate adjacent to said rows of deep trenches, wherein said isolation trench regions have a depth that is deeper than abutting bitline diffusion regions.

2. The method of claim 1 wherein step (a) includes the steps of farming a pad oxide layer on a surface of said Si-containing substrate; forming said bitline diffusion regions in said Si-containing substrate; depositing a first nitride pad layer on said pad oxide layer, patterning and etching through said first nitride pad layer and said pad oxide layer so as to form said plurality of deep trenches; forming capacitor and collar oxide regions in said plurality of deep trenches, wherein said collar oxide regions include recessed deep trench polysilicon; forming mandrel oxide regions on said recessed deep trench polysilicon, while forming divots in said collar oxide regions and depositing SiN in said divots.

3. The method of claim 2 wherein one of said SiN filled divots is subjected to a one-sided strap process which is capable of forming said buried-strap region.

4. The method of claim 1 wherein step (b) includes applying a one-sided strap process to remove said strap placeholder material from one side of the deep trenches and forming strap polysilicon in place thereof.

5. The method of claim 1 wherein step (c) includes the steps of recessing said exposed gate conductor, depositing a diffusion barrier layer in said recess; forming a conductive material on said diffusion barrier layer; recessing said conductive material and forming a dielectric capping layer on said recessed conductive material.

6. The method of claim 1 wherein step (d) includes forming an etch stop protective layer.

7. The method of claim 1 wherein step (e) includes forming a trench region in said Si-containing substrate; filling said trench region with at least an isolation material so as to form support isolation trench regions; and forming said support MOSFETS adjacent to said support isolation trench regions.

8. The method of claim 7 wherein said support MOSFETs are formed by forming a gate dielectric on a bare surface of said Si-containing substrate; forming a patterned gate conductor on said gate dielectric; subjecting said patterned gate conductor to a sidewall oxidation process; and forming source/drain regions in said Si-containing substrate adjacent to said patterned gate conductor.

9. The method of claim 8 further comprising forming gate conductor sidewall spacers on said patterned gate conductor and saliciding exposed Si surfaces.

10. The method of claim 1 wherein step (f) comprises forming a thin nitride layer and an ionic contamination protect layer on at least said support MOSFETs.

11. The method of claim 1 wherein step (g) includes depositing an insulator and etching said insulator.

12. The method of claim 1 wherein step (h) comprises forming doped polysilicon on bare Si-containing substrate; depositing a diffusion barrier layer on said doped polysilicon; forming a conductive material on said diffusion barrier layer, and forming a capping layer on said conductive material.

13. The method of claim 12 further comprising patterning said capping layer into bitline stripes.

14. The method of claim 1 wherein step (i) comprises etching through said bitline and into said Si-containing substrate selective to oxide so as to provide a trench that is below said bitline diffusion regions; and filling said trench with at least an insulating material so as to form said isolation trench regions.

* * * * *